(12) United States Patent
Fukumitsu et al.

(10) Patent No.: US 10,118,247 B2
(45) Date of Patent: Nov. 6, 2018

(54) METHOD FOR BONDING WAFERS (71) Applicant: Murata Manufacturing Co., Ltd., Nagaokakyo-shi, Kyoto-fu (JP)

(72) Inventors: Masakazu Fukumitsu, Nagaokakyo (JP); Shuhei Yamada, Nagaokakyo (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 0 days.

(21) Appl. No.: 15/599,714

(22) Filed: May 19, 2017

(65) Prior Publication Data

US 2017/0252855 A1    Sep. 7, 2017

Related U.S. Application Data (63) Continuation of application No. PCT/JP2015/082618, filed on Nov. 19, 2015.

(30) Foreign Application Priority Data

Nov. 21, 2014    (JP) .................................. 2014-236976

(51) Int. Cl.
*H01L 41/313*    (2013.01)
*B23K 20/02*    (2006.01)
(Continued)

(52) U.S. Cl.
CPC .............. *B23K 20/023* (2013.01); *B06B 1/06* (2013.01); *B06B 1/0603* (2013.01); *B23K 20/16* (2013.01);
(Continued)

(58) Field of Classification Search
None
See application file for complete search history.

(56) References Cited

U.S. PATENT DOCUMENTS 7,442,570 B2    10/2008    Nasiri et al.
9,162,879 B2    10/2015    Koarai
(Continued)

FOREIGN PATENT DOCUMENTS

JP    2011-200933 A    10/2011
JP    2014-1079393 A    6/2014
(Continued)

OTHER PUBLICATIONS

EV Group (EVG), "Wafer Bonding Processes for the Manufacture of MEMS devices for the Mobile Applications", SEMICON Taiwan 2012, Sep. 5 to 7, 2012.
(Continued)

*Primary Examiner* — Long Pham
(74) *Attorney, Agent, or Firm* — Arent Fox LLP (57) ABSTRACT Provided is a method for bonding wafers, which can bond the wafers to each other with high reliability while reducing the influence on the wafers. The method for bonding wafers includes the steps of: preparing a first wafer that has, on the surface thereof, a first metal layer with a first rigidity modulus, and a second wafer that has, on the surface thereof, a second metal layer with a second rigidity modulus higher than the first rigidity modulus; removing an oxide film at the surface of the second metal layer while an oxide film at the surface of the first metal layer is not removed; and bonding the surface of the first wafer to the surface of the second wafer.

2 Claims, 7 Drawing Sheets (51) Int. Cl.
*B06B 1/06* (2006.01)
*H01L 41/09* (2006.01)
*B23K 20/16* (2006.01)
*B23K 20/22* (2006.01)
*B81C 1/00* (2006.01)
*H01L 21/18* (2006.01)
*B23K 101/40* (2006.01)
*H03H 3/02* (2006.01)
*H03H 9/05* (2006.01)
*H03H 9/10* (2006.01)

(52) U.S. Cl.
CPC .......... *B23K 20/22* (2013.01); *B81C 1/00269* (2013.01); *H01L 21/187* (2013.01); *H01L 41/09* (2013.01); *H01L 41/313* (2013.01); *B06B 1/0648* (2013.01); *B23K 2101/40* (2018.08); *B81B 2201/0242* (2013.01); *B81C 2203/033* (2013.01); *B81C 2203/035* (2013.01); *H03H 3/02* (2013.01); *H03H 9/0595* (2013.01); *H03H 9/1035* (2013.01); *H03H 2003/026* (2013.01)

(56) References Cited

U.S. PATENT DOCUMENTS

| | | |
|---|---|---|
| 2012/0319220 A1 | 12/2012 | Noda et al. |
| 2015/0232329 A1* | 8/2015 | Classen ............... B81C 1/00269 257/782 |
| 2015/0239734 A1 | 8/2015 | Koarai |
| 2015/0294900 A1 | 10/2015 | Goto et al. |

FOREIGN PATENT DOCUMENTS

| | | |
|---|---|---|
| JP | 2014-192653 A | 10/2014 |
| WO | WO 2011/070627 A1 | 6/2011 |
| WO | WO 2014/020648 A1 | 2/2014 |

OTHER PUBLICATIONS

International Search Report issued in International Application No. PCT/JP2015/082618, dated Dec. 22, 2015.
Written Opinion of the International Searching Authority issued in International Application No. PCT/JP2015/082618, dated Dec. 22, 2015.

* cited by examiner

METHOD FOR BONDING WAFERS

CROSS REFERENCE TO RELATED APPLICATIONS

The present application is a continuation of International application No. PCT/JP2015/082618, filed Nov. 19, 2015, which claims priority to Japanese Patent Application No. 2014-236976, filed Nov. 21, 2014, the entire contents of each of which are incorporated herein by reference.

FIELD OF THE INVENTION

The present invention relates to a method for bonding wafers, in which the first wafer and the second wafer are bonded to each other by bonding a first metal layer formed on the surface of the first wafer to a second metal film formed on the surface of the second wafer.

BACKGROUND OF THE INVENTION

In bonding wafers to each other, for example, eutectic bonding is carried out. The bonded surfaces of metal layers of the wafers are oxidized in the atmosphere, thereby forming oxide films at the bonded surfaces. The oxide films are known to interfere with bonding between the wafers. To avoid interference with bonding, in Patent Document 1 and Patent Document 2, the bonded surface of a metal layer of a first wafer and the bonded surface of a metal layer of a second wafer are both subjected to a pre-treatment for removing or reducing oxide films with dilute hydrofluoric acid or a forming gas, or by sputtering.

On the other hand, in Non-Patent Document 1, neither the bonded surface of a metal layer of a first wafer nor the bonded surface of a metal layer of a second wafer is subjected to the pre-treatment for removing or reducing an oxide film. Instead, in Non-Patent Document 1, a relatively large load acts on a pair of wafers stacked on each other so as to apply a mechanical shock to the bonded surfaces of both the metal layers, and thus mechanically break the oxide films, thereby removing the oxide films, and at the same time, achieving eutectic bonding of the bonded surfaces to each other.

Patent Document 1: U.S. Pat. No. 7,442,570
Patent Document 2: Japanese Patent Application Laid-Open No. 2014-107393
Non-Patent Document 1: EV Group (EVG), "Wafer Bonding Processes for the Manufacture of MEMS devices for the Mobile Applications", SEMICON Taiwan 2012, Sep. 5 to 7, 2012

SUMMARY OF THE INVENTION

In Patent Documents 1 and 2, in a case where one of the wafers is a piezo-resonator of a MEMS (Micro Electro Mechanical Systems) device, when the pre-treatment for removing or reducing oxide films is also applied to the piezo-resonator, the pre-treatment may change oscillation characteristics of the piezo-resonator to an unacceptable extent. In addition, in Non-Patent Document 1, the high-load mechanical shock may cause the wafers themselves to be cracked, for example.

The present invention has been made in view of these circumstances, and an object of the invention is to provide a method which can bond wafers to each other with high reliability while reducing an adverse influence on the wafers.

A method for bonding wafers according to an aspect of the present invention includes preparing a first wafer that has, on the surface thereof, a first metal layer with a first rigidity modulus, and a second wafer that has, on the surface thereof, a second metal layer with a second rigidity modulus higher than the first rigidity modulus; removing a first oxide film on a first bonding surface of the second metal layer while not removing a second oxide film on a second bonding surface of the first metal layer; and bonding the first metal layer to the second metal layer.

DETAILED DESCRIPTION OF THE PREFERRED EMBODIMENTS

Figure 1:
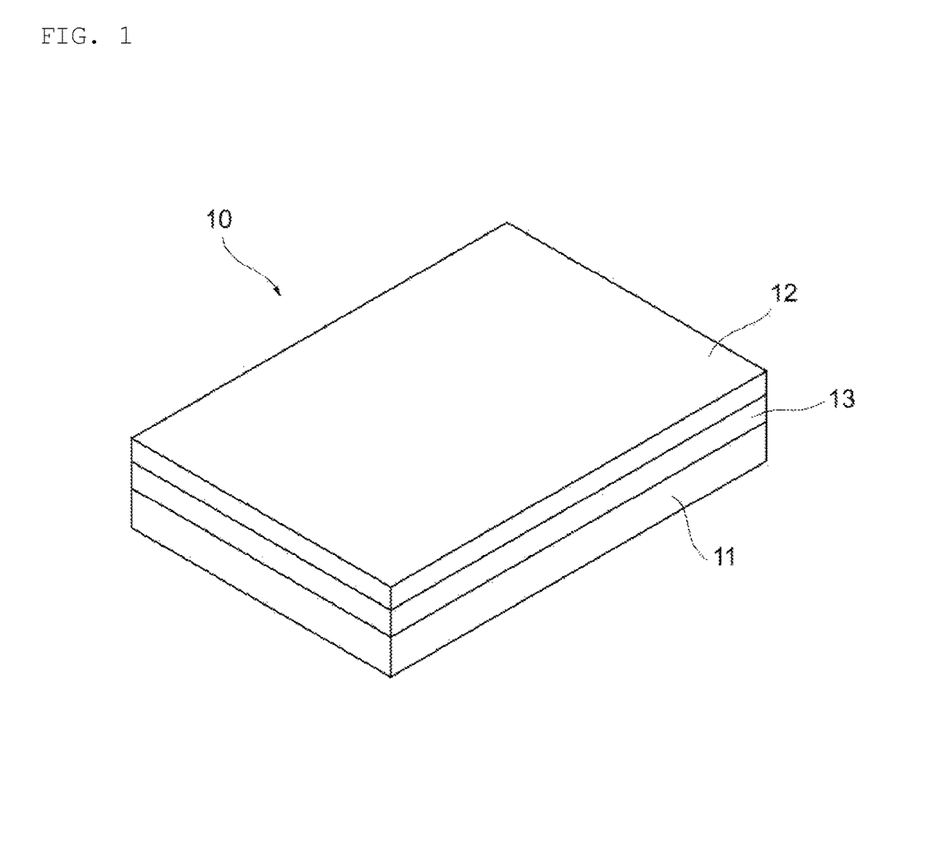
FIG. 1 is a perspective view schematically illustrating the appearance of a piezoelectric resonance device according to a specific example.

An embodiment of the present invention will be described below with reference to the accompanying drawings. FIG. 1 is a perspective view schematically illustrating the appearance of a piezoelectric resonance device 10 according to a specific example. This piezoelectric resonance device 10 includes a lower substrate 11, an upper substrate 12 that forms an oscillation space with the lower substrate 11, and a piezo-resonator 13 sandwiched and thus held between the lower substrate 11 and the upper substrate 12. The piezo-resonator 13 is a MEMS resonator manufactured by a MEMS technology. This piezoelectric resonance device 10 functions as, for example, a timing device incorporated in an electronic device such as a smartphone.

Figure 2:
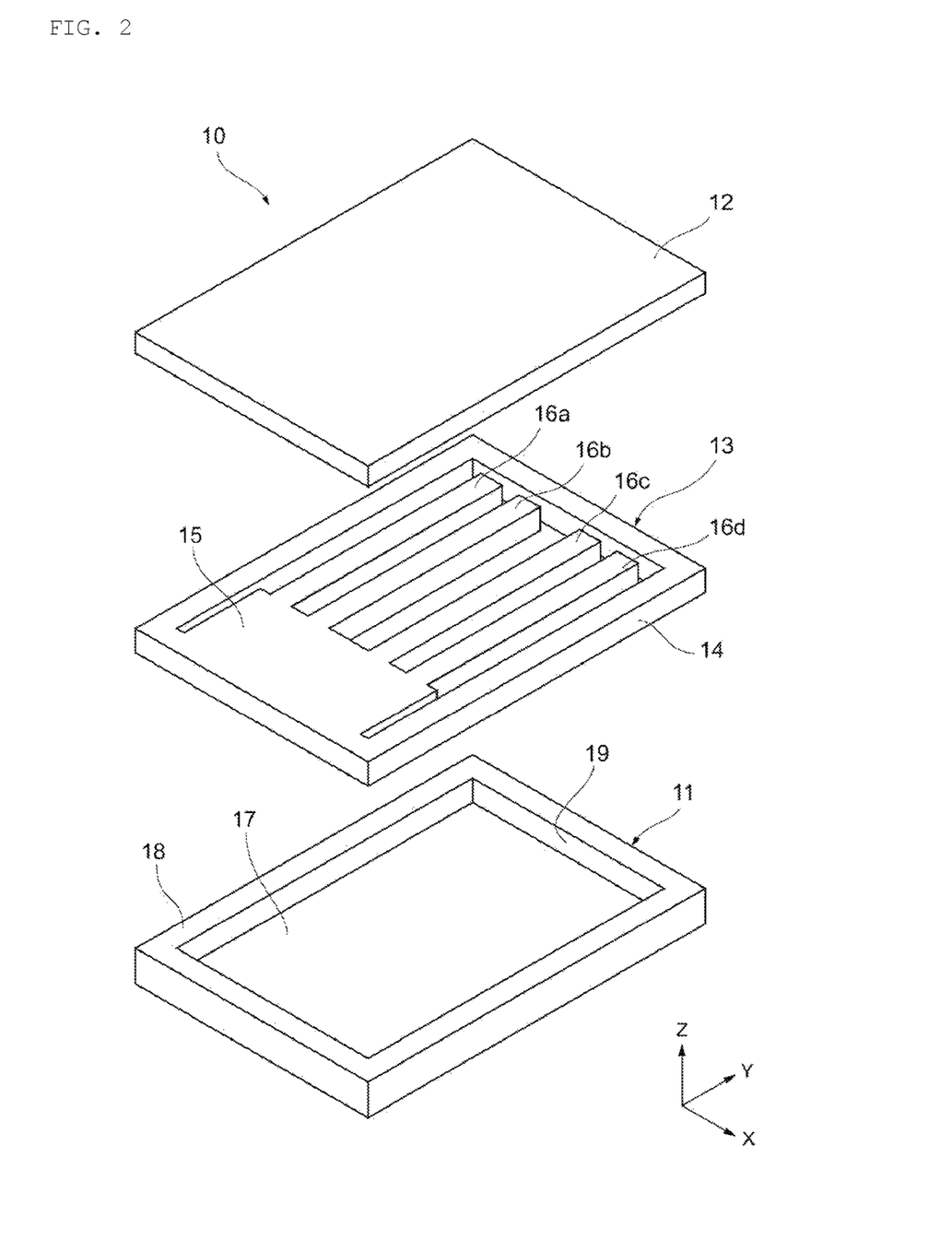
FIG. 2 is an exploded perspective view schematically illustrating the structure of a piezoelectric resonance device according to a specific example.

FIG. 2 is an exploded perspective view schematically illustrating the structure of a piezoelectric resonance device 10 according to a specific example. As shown in FIG. 2, the piezo-resonator 13 includes: a support frame 14 in the form of a rectangular frame along the XY plane in the orthogonal coordinate system in FIG. 2; a base 15 in the form of a flat plate along the XY plane in the support frame 14 that extends from one end of the support frame 14; and a plurality of oscillation arms 16a to 16d that each extend along the XY plane from a fixed end connected to the base 15 toward a free end. According to the present embodiment, the four oscillation arms 16a to 16d extend parallel to the Y axis. It is to be noted that the number of oscillation arms is not limited to 4.

Figure 3:
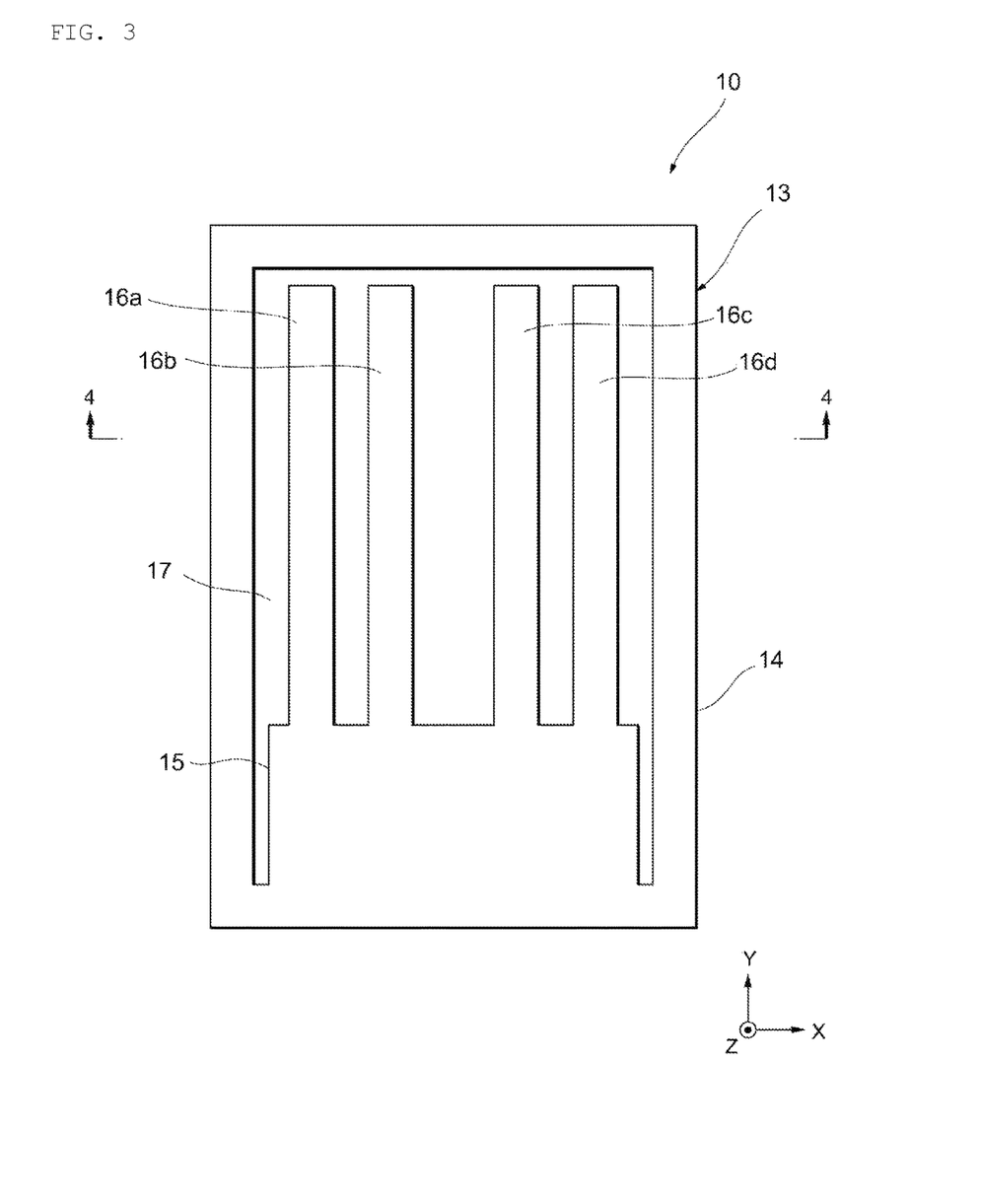
FIG. 3 is a plan view of a piezoelectric resonance device with an upper substrate removed therefrom.

FIG. 3 is a plan view of the piezoelectric resonance device 10 with the upper substrate 12 removed therefrom. Referring to FIGS. 2 and 3 together, each of the oscillation arms 16a to 16d is in the form of a prism, and all of them are the same size. The lower substrate 11 includes: a bottom plate 17 in the form of a flat plate that extends along the XY plane; and a side wall 18 that extends upward from a peripheral edge of the bottom plate 17 along the Z-axis direction. The inner surface of the lower substrate 11, that is, the surface of the bottom plate 17 and the inner surface of the side wall 18 form a depression 19. The depression 19 forms a part of the oscillation space for the oscillation arms 16a to 16d.

Figure 4:
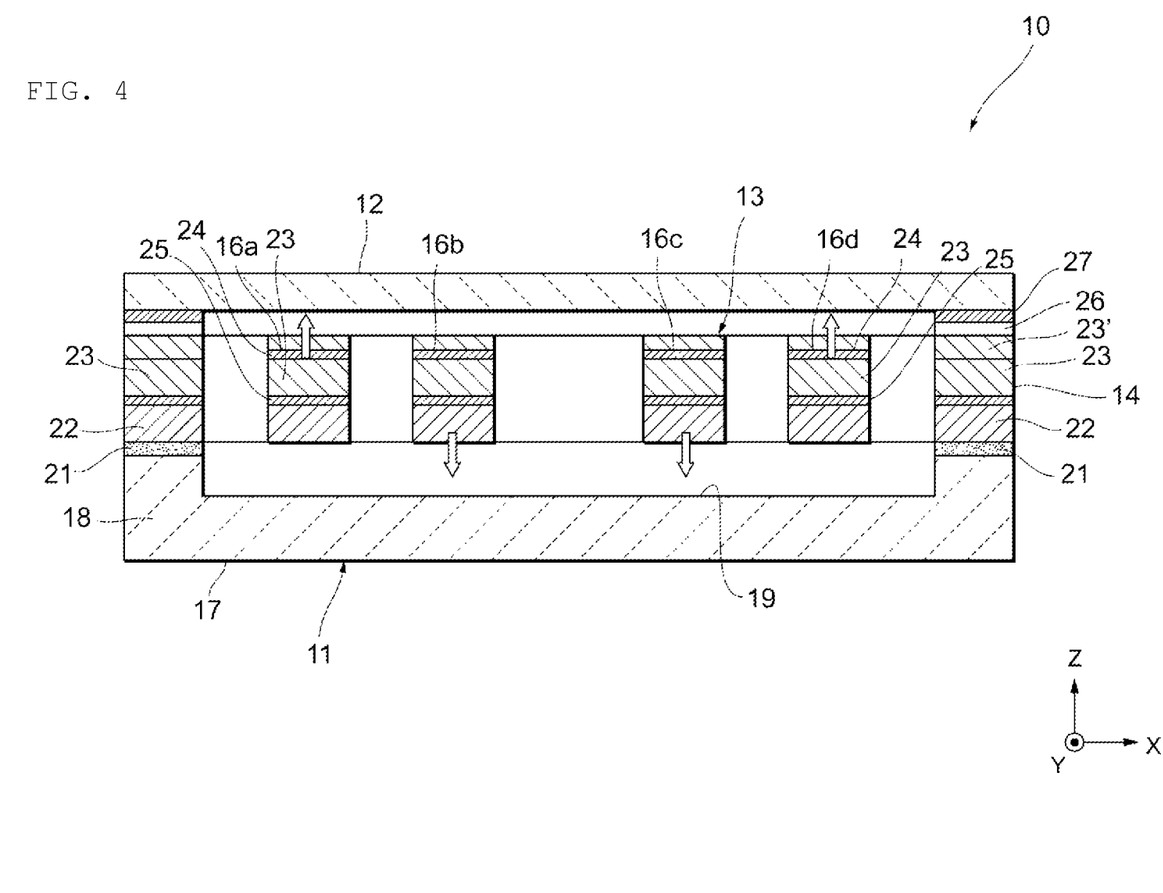
FIG. 4 is a cross-sectional view of FIG. 3 along the line 4-4.

FIG. 4 is a cross-sectional view of the piezoelectric resonance device 10 along the line 4-4 of FIG. 3 (with the upper substrate 12 in place). Referring to FIG. 4, in the case of the piezoelectric resonance device 10 according to a specific example, the support frame 14 of the piezo-resonator 13 is received on the side wall 18 of the lower substrate 11, and the piezo-resonator 13 is covered with the upper substrate 12. In this way, the piezo-resonator 13 is held between the lower substrate 11 and the upper substrate 12, and the lower substrate 11, the upper substrate 12, and the support frame 14 of the piezo-resonator 13 form the oscillation space for the oscillation arms 16a to 16d. This oscillation space is kept airtight, and a vacuum state is preferably maintained. The upper substrate 12 is formed, for example, in a flat plate shape. It is to be noted that a depression (not shown), for example, on the order of 50 μm in depth may be formed in the inner surface of the upper substrate 12 in order to ensure a larger oscillation space.

The bottom plate 17 and the side wall 18 of the lower substrate 11 are formed integrally from Si (silicon). On the upper surface of the side wall 18, a silicon oxide film (for example, a $SiO_2$ (silicon dioxide) film) 21 is formed, and this silicon oxide film 21 is used for bonding between the lower substrate 11 and the support frame 14 of the piezo-resonator 13. The thickness of the lower substrate 11, which is defined in the Z-axis direction, is set to, for example, 150 μm, and the depth of the depression 19 is set to, for example, 50 μm.

In the case of the piezo-resonator 13, the support frame 14, the base 15, and the oscillation arms 16a to 16d are formed from a Si (silicon) layer 22 and an AlN (aluminum nitride) layer 23 laminated on the Si layer 22. As for the oscillation arms 16a to 16d, the length defined in the Y-axis direction is set to, for example, on the order of 500 μm, the width defined in the X-axis direction is set to, for example, on the order of 50 μm, and the thickness defined in the Z-axis direction is set to, for example, on the order of 6 μm.

Each of the oscillation arms 16a to 16d includes first and second Mo (molybdenum) layers 24, 25 respectively formed on the upper surface and lower surface of the above-described AlN layer 23, so as to sandwich the AlN layer 23. The first and second Mo layers 24, 25 form first and second electrodes, respectively. In addition, an AlN layer 23' is laminated over the Mo layer 25. The first and second Mo layers 24, 25 are connected to, for example, an alternating-current power supply (not shown) provided outside the piezo-resonator 13. For the connection, for example, an electrode (not shown) formed on the outer surface of the upper substrate 12 and a through silicon via (TSV) (not shown) formed in the upper substrate 12 are used. The AlN layer 23' is a layer for protecting the Mo layer 25. It is to be noted that the AlN layer 23' is not limited to an aluminum nitride layer, as long as the layer is formed from an insulator.

The AlN layer 23 is a piezoelectric film that converts an applied voltage to oscillations. In place of the AlN layer 23, for example, a ScAlN (scandium aluminum nitride) layer may be used. The AlN layer 23 extends and contracts in the in-plane direction, that is, the Y-axis direction of the XY plane, in response to an electric field applied through the first and second Mo layers 24, 25 to the AlN layer 23. This extension and contraction of the AlN layer 23 cause the oscillation arms 16a to 16d to undergo flexure and displacement in a perpendicular direction (Z-axis direction) with respect to the XY plane. More specifically, the oscillation arms 16a to 16d cause the free ends thereof to undergo displacement toward the inner surfaces of the lower substrate 11 and the upper substrate 12, thereby oscillating in an out-of-plane flexural oscillation mode.

In the piezoelectric resonance device 10 according to a specific example, as is clear from FIG. 4, the phase of an electric field applied to the outer oscillation arms 16a, 16d and the phase of an electric field applied to the inner oscillation arms 16b, 16c are set to be opposite phases to each other, thereby causing the outer oscillation arms 16a, 16d and the inner oscillation arms 16b, 16c to undergo displacement in opposite directions to each other. For example, when the outer oscillation arms 16a, 16d cause the free ends thereof to undergo displacement toward the inner surface of the upper substrate 12, the inner oscillation arms 16b, 16c cause the free ends thereof to undergo displacement toward the inner surface of the lower substrate 11.

The upper substrate 12 is formed from flat plate-like Si (silicon) of predetermined thickness, which extends along the XY plane. As is clear from FIG. 4, the upper substrate 12 is, at a peripheral edge thereof, received on the support frame 14 of the piezo-resonator 13. The piezo-resonator 13 and the upper substrate 12 are bonded to each other by eutectic bonding between a first metal layer 26 formed on the upper surface of the support frame 14 of the piezo-resonator 13 and a second metal 27 formed on a peripheral edge of the lower surface of the upper substrate 12.

It is to be noted that the first metal layer is preferably formed from a metal containing Al (aluminum) as its main constituent, whereas the second metal layer is preferably formed from a metal containing Ge (germanium) as its main constituent. The metal containing Al as its main constituent refers to a metal containing 95 wt % or more of Al in percentage by weight. In addition, the metal containing Ge as its main constituent refers to a metal containing 95 wt % or more of Ge in percentage by weight.

In the present embodiment, an Al film 26 for the first metal layer and a Ge film 27 for the second metal layer will be described as an example.

It is to be noted that more preferably, the first metal layer is formed from an AlCu (aluminum-copper alloy) film or an AlSiCu (aluminum-silicon-copper alloy) film. In this case, for example, the percentage of Cu by weight is, for example, 0.5 wt % or 1.0 wt %.

In the case of using an AlCu film or an AlSiCu film for the first metal layer, migration and hillock of Al are suppressed by heat treatment in a bonding step or a step prior to the bonding step. Accordingly, the case of using an AlCu film or an AlSiCu film as the first metal layer makes it possible to prevent voids from being generated locally.

Figure 5A:
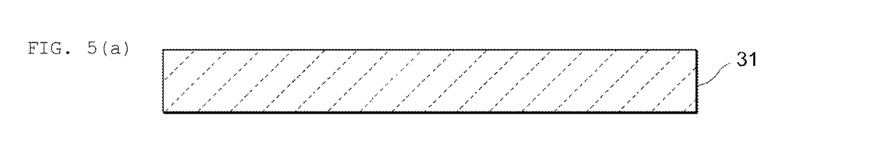
FIGS. 5(a) to 5(e) are each a cross-sectional view for explaining a method for manufacturing a piezoelectric resonance device according to an embodiment of the present invention.
Figure 5B:
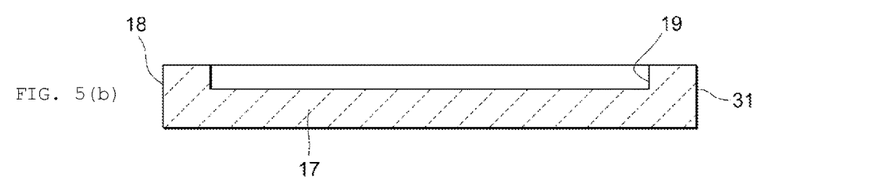

Next, a method for manufacturing the piezoelectric resonance device 10 according to an embodiment of the present invention will be described below. FIGS. 5(a) to 5(e) are each a cross-sectional view for explaining a method for manufacturing the piezoelectric resonance device 10 according to an embodiment of the present invention. As shown in FIG. 5(a), first, a flat plate-like wafer, that is, a lower wafer 31 is prepared. The lower wafer 31 is formed from, for example, silicon. The lower wafer 31 has a plurality of defined sections arranged at predetermined intervals, and each section corresponds to the lower substrate 11. In the present embodiment, for the sake of explanation, only one section is illustrated. As shown in FIG. 5(b), in the flat upper surface of the lower wafer 31, the depression 19 of a predetermined depth is formed, for example, by etching. Preferably, the lower wafer 31 is large enough such that a plurality of lower substrates 11 with depressions 19 can be formed in the lower wafer 31.

Figure 5C:
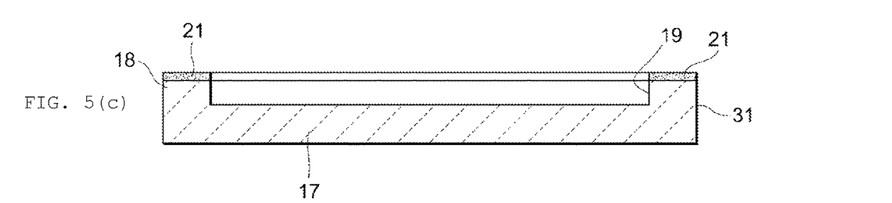
Figure 5D:
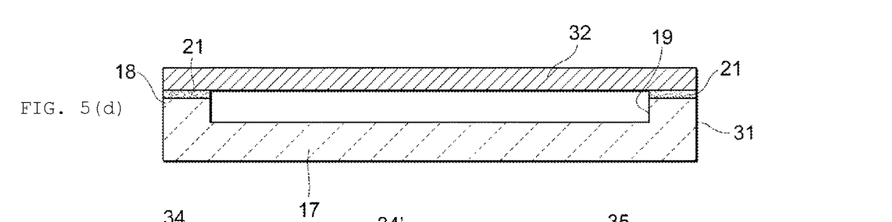
Figure 5E:
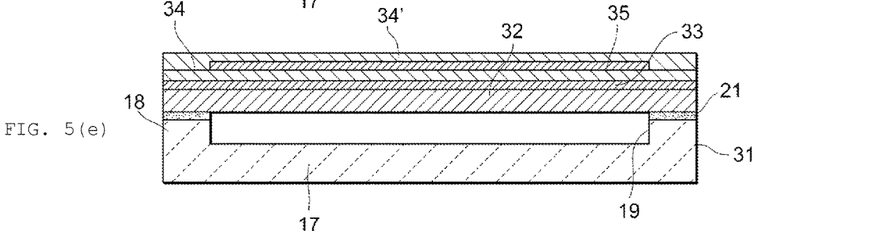

Thereafter, as shown in FIG. 5(c), the silicon oxide film 21 for bonding is patterned on the upper surface of the side wall 18. Next, as shown in FIG. 5(d), a flat plate-like Si substrate 32 is bonded onto the silicon oxide film 21, for example, by direct bonding. Subsequently, as shown in FIG. 5(e), a first Mo film 33, an AlN film 34, a second Mo film 35, and an AlN film 34' are sequentially deposited on the Si substrate 32, for example, by sputtering. In this regard, there is no need for the first Mo film 33 and the second Mo film 35 to be formed entirely on the upper surface of the Si substrate 32. Rather, the films can be formed, for example, only in a region corresponding to locations where the first and second electrodes are to be formed.

Figure 6A:
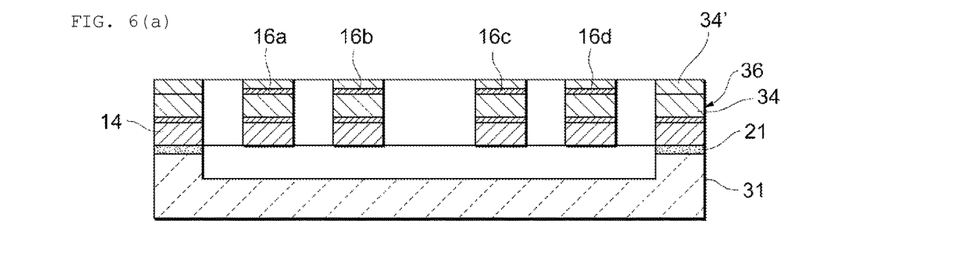
FIGS. 6(a) to 6(c) are each a cross-sectional view for explaining a method for manufacturing a piezoelectric resonance device according to an embodiment of the present invention.

Thereafter, as shown in FIG. 6(a), the first Mo film 33, the AlN film 34, the second Mo film 35, and the AlN film 34' are subjected to, for example, dry etching or wet etching, to form the support frame 14, the base 15, and the oscillation arms 16a to 16d described above. In this way, the piezo-resonator 13 is formed which is supported by the support frame 14 on the side wall 18 for each of the plurality of lower substrates 11 defined in the lower wafer 31. According to the present embodiment, a first wafer, that is, a MEMS wafer 36 is formed through the formation of a plurality of piezoelectric resonators 13 on the lower wafer 31.

Figure 6B:
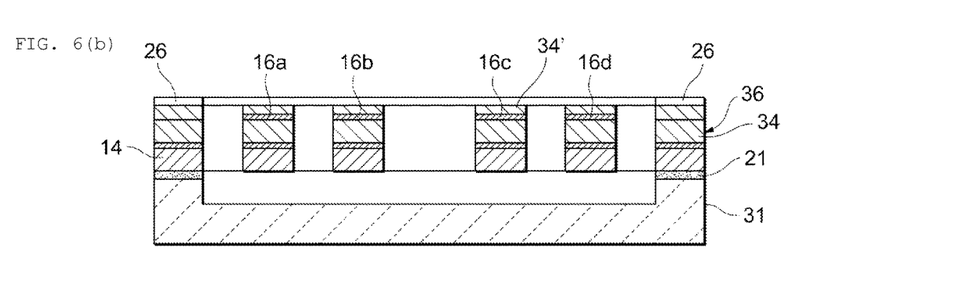

Thereafter, as shown in FIG. 6(b), the first metal layer (i.e., the Al film 26) is deposited on the upper surface of the support frame 14. The Al film 26 has a first rigidity modulus, for example, a rigidity modulus of 26 GPa. The surface of the Al film 26 is oxidized in the atmosphere, and thus an oxide film of Al (not shown) is formed at the bonding surface thereof. In the present embodiment, no pre-treatment is carried out for removing this oxide film formed on the bonding surface of the Al film 26. It is to be noted that in the present embodiment, the "removing" of the oxide film includes a treatment of substantially removing the oxide film, for example, through the "reduction" of the oxide film.

Figure 6C:
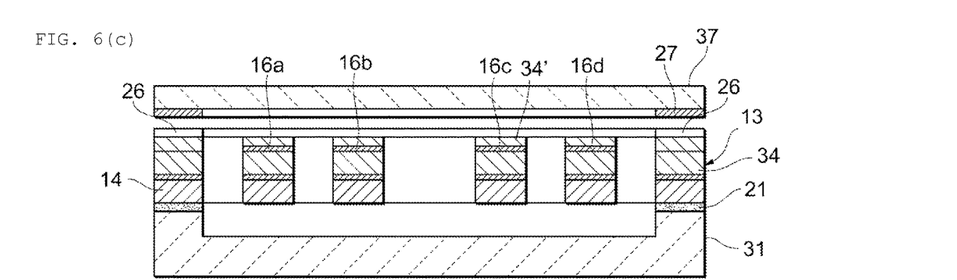

Thereafter, as shown in FIG. 6(c), a second wafer, that is, an upper wafer 37 is prepared. The upper wafer 37 is formed from, for example, silicon. The upper wafer 37 has a plurality of defined sections arranged at predetermined intervals, and each section corresponds to an upper substrate 12. Each section corresponds to a location of a respective lower substrate 11 of the lower wafer 31. At a site where the upper wafer 37 is to be bonded to the support frame 14, the second metal layer (i.e., the Ge film 27) is formed in advance, for example, by sputtering. The Ge film 27 has a second rigidity modulus higher than the first rigidity modulus, for example, a rigidity modulus of 41 GPa.

As with the Al film 26, the surface of the Ge film 27 is oxidized in the atmosphere, and an oxide film of Ge (not shown) is thus formed on the bonding surface thereof. In the present embodiment, a pre-treatment is carried out in advance for removing the oxide film formed at the bonding surface of the Ge film 27. Examples of the pre-treatment include a treatment of removing the oxide film by washing the bonded surface with dilute hydrofluoric acid (HF), a treatment of removing the oxide film by sputtering with ion beams or the like, and a treatment of removing the oxide film through the reduction of the oxide film with a forming gas or the like.

Figure 7:
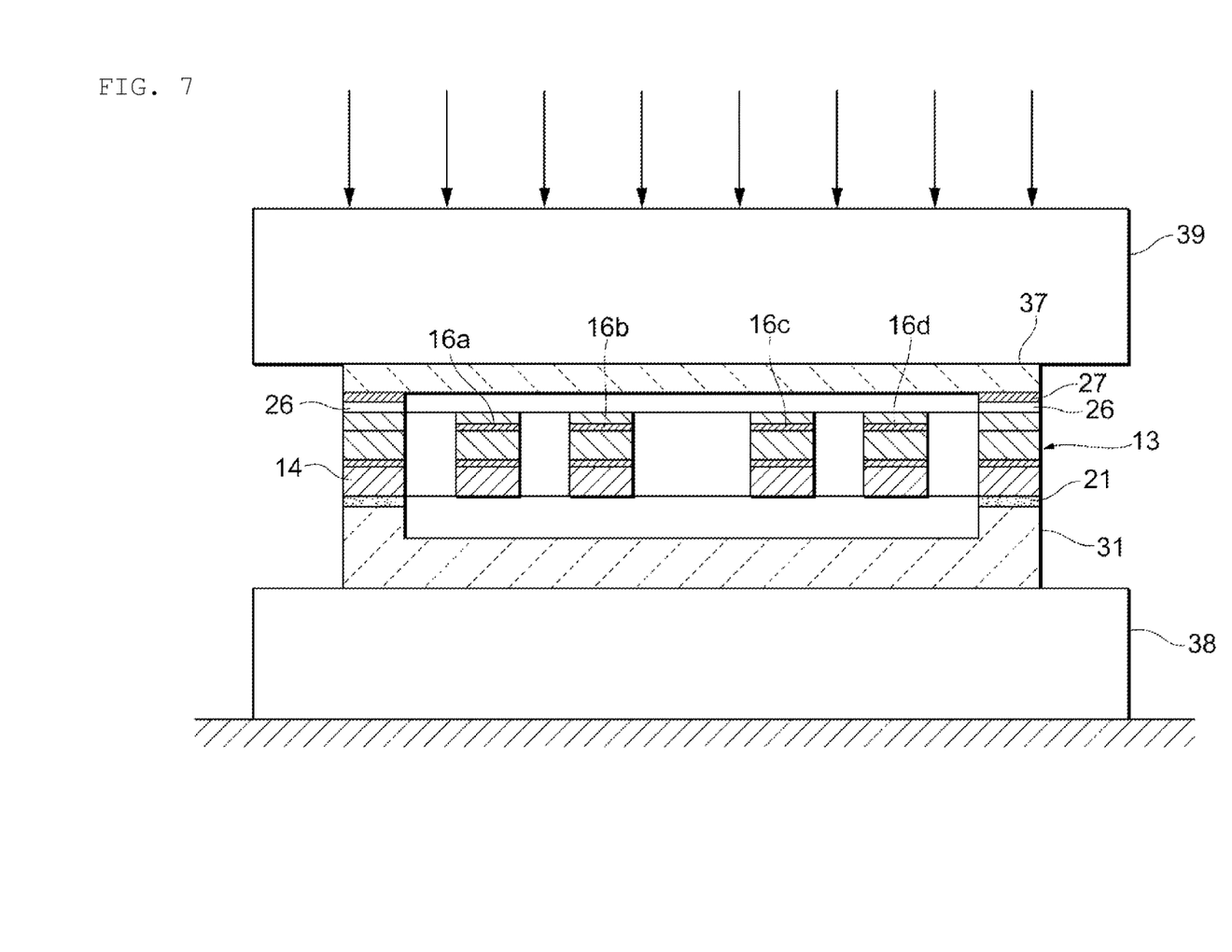
FIG. 7 is a cross-sectional view for explaining a method for manufacturing a piezoelectric resonance device according to an embodiment of the present invention.

As shown in FIG. 7, the upper wafer 37 is arranged to face the surface of the MEMS wafer 36 such that the Ge film 27 is positioned on the Al film 26. The lower wafer 31, the MEMS wafer 36, and the upper wafer 37 are sandwiched between a lower heater 38 and an upper heater 39. The lower heater 38 and the upper heater 39 heat the lower wafer 31, the MEMS wafer 36, and the upper wafer 37 at a temperature of, for example, 400° C. to 450° C. over a predetermined period of time. During the heating, a load with a pressure of, for example, 15 MPa acts on the lower wafer 31, the MEMS wafer 36, and the upper wafer 37.

In this regard, a mechanical shock is applied to the bonding surfaces of the Al film 26 and the Ge film 27 due to the action of the load. Because the rigidity modulus of the Ge film 27 is higher than the rigidity modulus of the Al film 26, the oxide film of the Al film 26 in contact with the bonding surface of the Ge film 27 is easily broken by the mechanical shock. As a result, the oxide film is removed from the bonding surface of the Al film 26, and thus eutectic bonding is established between the Al film 26 and the Ge film 27 by the applied heat and load. In this way, the upper wafer 37 is bonded to the MEMS wafer 36. Thereafter, each piezoelectric resonance device 10 is manufactured by cutting, for example, with a dicing machine.

In accordance with the method for manufacturing the piezoelectric resonance device 10 as described above, the oxide film of the Ge film 27 with a higher rigidity modulus is removed in advance by the pre-treatment, and thus, in bonding the Al film 26 to the Ge film 27, the mechanical shock with the load can cause the Ge film 27 to easily break the oxide film of the Al film 26 because it is lower in rigidity modulus than the Ge film 27. As a result, the non-oxidized Al film 26 is exposed at the bonding surface of the Al film 26, and thus the Al film 26 and the Ge film 27 can be subjected to eutectic bonding with high reliability. In addition, since the MEMS wafer 36 is not subjected to any pre-treatment, the influence on the MEMS wafer 36, and the influence on oscillation characteristics of the piezo-resonator 13 is thus kept to a minimum.

In contrast, according to the technique disclosed in Non-Patent Document 1 mentioned above, at both the bonded surface of the Al film and the bonded surface of the Ge film, no oxide film is removed before bonding, but the oxide films of the Al film and the Ge film are mechanically broken by using a large load that acts on the Al film and the Ge film for the bonding. However, using a large load increases the possibility of cracking or the like of the wafer to be bonded. In addition, because of using the large load, the facility cost for the bonding machine is expected to increase.

On the other hand, according to the present invention, since only the oxide film of the Al film 26 with a lower rigidity modulus has to be removed in the implementation of eutectic bonding as described above, a relatively small load is only needed to act on the lower wafer 31, the MEMS wafer 36, and the upper wafer 37, thereby easily achieving eutectic bonding between the Al film 26 and the Ge film 27. In addition, only a low load is enough for the lower wafer 31, the MEMS wafer 36, and the upper wafer 37, thus making it possible to significantly reduce the possibility of cracking or the like of the lower wafer 31, the MEMS wafer 36, and the upper wafer 37.

In addition, when the techniques described in Patent Documents 1 and 2 mentioned above are applied to MEMS wafers, the pre-treatment of removing oxide films with dilute hydrofluoric acid causes sticking such as, for example, adhesion between ends of oscillation arms of piezo-resonators. In addition, the removal of oxide films with dilute hydrofluoric acid or a forming gas, or by sputtering removes, at the same time, not only the Al films and the Ge films, but also the oxide films of Si and SiO$_2$ constituting the piezoelectric resonators, and may thus change oscillation characteristics of the piezo-resonators to an unacceptable extent.

On the other hand, according to the present invention, the oxide film formed at the surface of the Al film 26 with a lower rigidity modulus is removed by the mechanical shock with a low load and allows for eutectic bonding as described above, and the pre-treatment for the removal of the oxide film is thus not required for the MEMS wafer 36 with the Al film 26. Accordingly, the method for bonding wafers according to the present invention can avoid, in a reliable manner, disadvantages such as sticking of the oscillation arms 16 to 16d and removal of oxide films that are not required to be removed. As a result, the possibility of changing oscillation characteristics of the piezo-resonator 13 can be kept to a minimum.

The inventors verified the advantageous effect of the method for bonding wafers according to the present invention. For the verification, the inventors prepared first to third samples. For each sample, prepared were: a first wafer of Si, AlN, and Al laminated to have film thicknesses of 525 μm, 0.5 μm, and 0.9 μm, respectively; and a second wafer of Si, SiO$_2$, Ti, and Ge laminated to have film thicknesses of 525 μm, 0.5 μm, 0.1 μm, and 0.5 μm, respectively. The first wafer corresponds to the MEMS wafer 36 described above, whereas the second wafer corresponds to the upper wafer 37 described above.

For the verification, the condition was changed for the pre-treatment (treatment for oxide film removal) carried out for each sample. Neither the bonded surface of Al nor the bonded surface of Ge was subjected to the pre-treatment for the first sample, whereas the bonded surface of Al and the bonded surface of Ge were both subjected to the pre-treatment for the second sample. In addition, for the third sample, the bonded surface of Al was not subjected to the pre-treatment, whereas the bonded surface of Ge was subjected to the pre-treatment. More specifically, the third sample corresponds to a specific example of the present invention.

For each sample, the first wafer and the second wafer were stacked on each other such that Al and Ge were brought into contact with each other, and with a heater, the first wafer and the second wafer were heated at 400° C. over 20 minutes, and then heated at 440° C. over 15 minutes. During the heating, at a pressure of 15 MPa, a load was allowed to act on the first wafer and the second wafer. After the heating, cross sections of the bonded surfaces of Al and Ge were observed with an infrared (IR) microscope.

As a result, it has been confirmed that there is no eutectic reaction between Al and Ge in the case of the first sample subjected to no pre-treatment at all. Accordingly, it has been confirmed that it is difficult to achieve eutectic bonding, unless the bonded surfaces are subjected to the pre-treatment. In addition, a eutectic reaction has been confirmed in the case of the second sample with the bonded surfaces both subjected to the pre-treatment. Furthermore, a eutectic reaction has also been confirmed in the case of the third sample as a specific example of the present invention. This verification has succeeded in confirming that eutectic bonding is reliably established between Al and Ge merely by removing the oxide film of the Ge film with a higher rigidity modulus. It is to be noted that the inventors have confirmed eutectic bonding even at a pressure of 5 MPa in the case of the third sample. In addition, in the case of the first sample, a load for bonding, for example, a load on the order of several times as large as the load for bonding according to the present invention is expected to be required in order to establish bonding between Al and Ge.

It is to be noted that while the piezoelectric resonance device 10 according to the embodiment described above has been described to function as a timing device, the device may be configured to function as, for example, a gyro sensor. In addition, the bonding method and manufacturing method according to the present invention can be applied to any devices as long as those devices can withstand temperatures, for example, on the order of 400° C. to 450° C. for bonding, and because Al and Ge, as examples, are metal materials which are less likely to serve as contamination sources in Si semiconductor manufacturing lines.

It is to be noted that the present embodiment is intended to facilitate understanding of the present invention, but not intended to construe the present invention in any limited way. Modifications and/or improvements can be made to the present invention without departing from the spirit of the invention, and the present invention encompasses equivalents thereof.

DESCRIPTION OF REFERENCE SYMBOLS

10: piezoelectric resonance device
13: piezo-resonator
26: first metal layer (Al film)
27: second metal layer (Ge film)
31: lower wafer
36: MEMS wafer
37: upper wafer

The invention claimed is:

1. A method for bonding wafers, the method comprising:
preparing a first wafer having a first metal layer with a first rigidity modulus, the first metal layer being formed from an aluminum-copper alloy, the percentage of copper in the aluminum-copper alloy by weight being 1 wt % or less, aluminum being the main constituent of the first metal layer;
preparing a second wafer having a second metal layer with a second rigidity modulus higher than the first rigidity modulus, the second metal layer being formed from a second metal containing germanium as its main constituent;
removing a first oxide film on a first surface of the second metal layer while not removing a second oxide film on a second surface of the first metal layer; and
bonding the first surface of the second metal layer to the second surface of the first metal layer in such a manner that the oxide film on the second surface of the first metal layer is broken due to mechanical shock.

2. A method for bonding wafers, the method comprising:
preparing a first wafer having a first metal layer with a first rigidity modulus, the first metal being formed of an aluminum-copper alloy, the percentage of copper by weight in the aluminum-copper alloy by weight being 1% or less, aluminum being the main constituent of the first metal layer, the first metal being one of an alloy of aluminum and copper and an alloy of aluminum, silicon and copper;
preparing a second wafer having a second metal layer with a second rigidity modulus higher than the first rigidity modulus, the second metal layer is formed of a metal containing germanium;
removing a first oxide film on a first surface of the second metal layer while not removing a second oxide film on a second surface of the first metal layer; and bonding the first surface of the second metal layer to the second surface of the first metal layer in such a manner that the oxide film on the second surface of the first metal layer is broken due to mechanical shock.

* * * * *